United States Patent
Clauvelin et al.

(10) Patent No.: US 11,333,685 B1
(45) Date of Patent: May 17, 2022

(54) FUNCTIONAL SAFETY OF MEASUREMENTS

(71) Applicant: Sendyne Corporation, New York, NY (US)

(72) Inventors: Nicolas Clauvelin, New York, NY (US); Victor Marten, New York, NY (US)

(73) Assignee: Sendyne Corporation, New York, NY (US)

( * ) Notice: Subject to any disclaimer, the term of this patent is extended or adjusted under 35 U.S.C. 154(b) by 0 days.

(21) Appl. No.: 17/309,697

(22) PCT Filed: Feb. 16, 2021

(86) PCT No.: PCT/US2021/070158
§ 371 (c)(1),
(2) Date: Jun. 15, 2021

(87) PCT Pub. No.: WO2021/163734
PCT Pub. Date: Aug. 19, 2021

Related U.S. Application Data

(60) Provisional application No. 62/976,260, filed on Feb. 16, 2020.

(51) Int. Cl.
*G01R 15/14* (2006.01)
*G01R 1/20* (2006.01)

(52) U.S. Cl.
CPC .......... *G01R 15/148* (2013.01); *G01R 1/203* (2013.01)

(58) Field of Classification Search
CPC ...... G01R 15/12; G01R 15/14; G01R 15/146; G01R 15/148; G01R 1/20; G01R 1/203; G01R 35/005; G01R 17/16; G01R 1/30
See application file for complete search history.

(56) References Cited

U.S. PATENT DOCUMENTS

| | | |
|---|---|---|
| 9,588,144 B2 | 3/2017 | Marten |
| 2009/0021239 A1 | 1/2009 | Hashimoto |
| 2013/0009655 A1* | 1/2013 | Marten .............. G01R 19/0092 324/713 |
| 2015/0145535 A1* | 5/2015 | Nys ..................... G06F 3/04182 324/679 |
| 2016/0356825 A1 | 12/2016 | Bae |
| 2019/0339304 A1 | 11/2019 | Panine |

FOREIGN PATENT DOCUMENTS

| | | |
|---|---|---|
| KR | 20130028858 A | 3/2013 |
| KR | 20160144262 A | 12/2016 |

OTHER PUBLICATIONS

International search report in PCT/US2021/070158 dated Jun. 7, 2021.
Written Opinion in PCT/US2021/070158 dated Jun. 7, 2021.

* cited by examiner

Primary Examiner — Son T Le
(74) Attorney, Agent, or Firm — Oppedahl Patent Law Firm LLC

(57) ABSTRACT

Switching of particular inputs in a signal processing channel permits an independent evaluation of that signal processing channel, in a system where there are at least two signal processing channels, one of which is able to be calibrated while the other of which is measuring current in a shunt. Switching a controlled current through a shunt, the controlled current being small in value compared with an overall current being measured, permits yet another independent evaluation of the shunt.

6 Claims, 2 Drawing Sheets

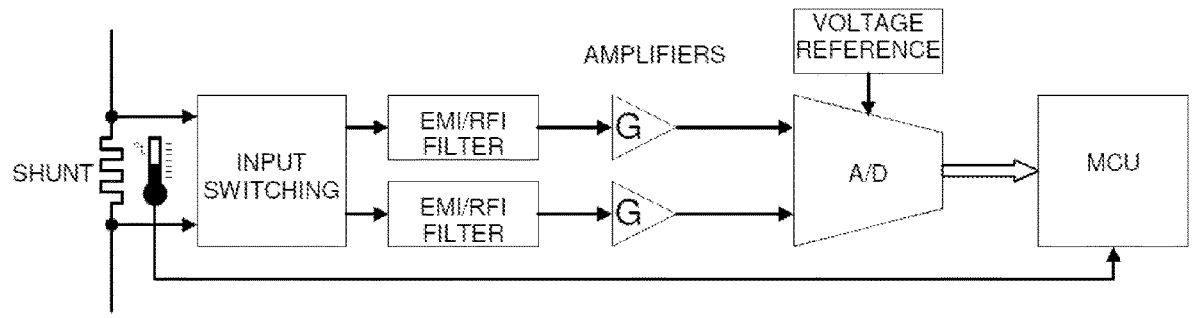
Fig. 1 – PRIOR ART
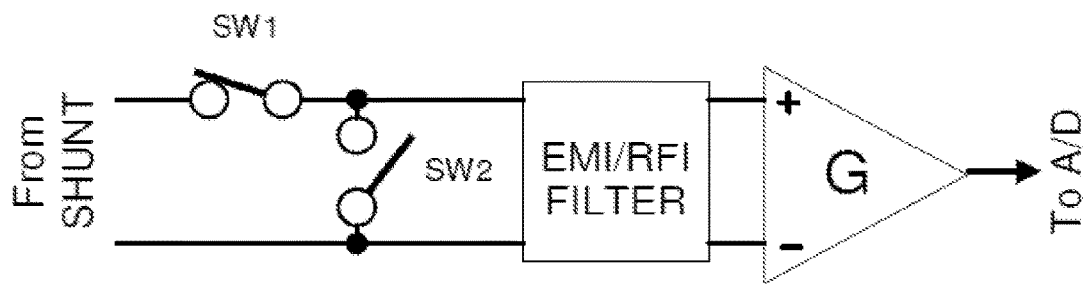
Fig. 2 – PRIOR ART
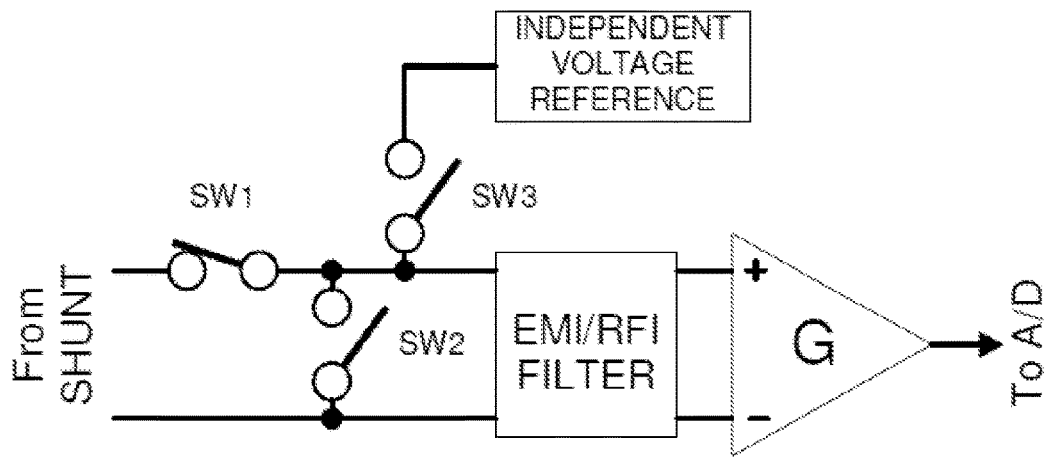
Fig. 3

FUNCTIONAL SAFETY OF MEASUREMENTS

BACKGROUND

It is fairly easy to measure high current amplitudes coarsely. It is not at all easy to measure high current amplitudes extremely accurately. The present invention directs itself to the goal of measuring high currents accurately, while carrying out the measurement in a safe way.

Functional safety has become an important topic. Automotive standard ISO 26262 is now being applied to electrical circuits and systems, with emphasis on assuring proper and accurate operations, detecting faults, and reacting in a safe way. The standard calls for such monitoring and diagnostic functions to be active at all times, and yet without impeding normal functions of circuits and systems. It is not easy to accomplish these goals, and some ways of accomplishing these goals add a significant amount of circuitry. It is thus desirable if these goals can be achieved while somehow not adding a significant amount of circuitry, as this would create additional costs and reduce reliability simply due to a larger number of elements that can fail.

Therefore, it is desirable to incorporate the safety-monitoring functions with as few additional components as possible.

As described in U.S. Pat. No. 9,588,144, assigned to the same assignee as the assignee of the present application, a current measurement system may consist of the elements shown in FIG. 1. High currents pass through a shunt, shown at left in the figure. There are two sensing locations, one above the resistive area of the shunt and one below the resistive area of the shunt as it appears in the figure, which are employed to measure a potential difference (voltage difference). From these sensing locations, two leads connect to an input switching fabric which selectively connects the sensing leads to a first signal processing channel at the top middle of the figure, or to a second signal processing channel at the bottom middle of the figure. Each signal processing channel starts with an electromagnetic interference and radio frequency interference filter, passing the sensed voltage to an amplifier with gain G. This is passed to an analog-to-digital converter (A/D) the output of which passes to a microcontroller unit (MCU). The MCU also receives information from a temperature sensor, so that the MCU can take into account the temperature of the shunt.

In this system, a chief aspect is that any particular signal processing channel is capable of being placed into operational service on the one hand, or being placed into a calibration status on the other hand. A distinction is thus made between "operation" and "calibration". One of the teachings of the '144 patent is to set things up so that one of the signal processing channels is being calibrated while the other signal processing channel is providing a flow of the current measurement data. At any given instant, one signal processing channel or the other is in operational mode, the result being that there is an uninterrupted flow of measurement data from the shunt to the MCU.

In an exemplary application of this system as described in the '144 patent, the shunt and the rest of the current measurement system is put to use in an electric vehicle ("EV"). The shunt is employed to measure as accurately as possible the current flowing into and out of the battery of the EV, which in turn permits arriving at a modeled SOC (state of charge) that can be more accurate than would otherwise be the case. This in turn permits a predicted driving range for the EV that is as reliable as possible.

As was mentioned above, the current measurement system of FIG. 1 has a temperature sensor. This permits the system to take into account many thermally influenced effects (such as change of the resistance of the shunt, change of the gain of the amplifiers, change of the voltage reference, and change in the characteristics of the A/D converter). The '144 patent teaches the digital adjustment of the measured values for the combined data acquisition chain and the shunt, based on the temperature of the shunt.

The system set forth in the '144 patent offers many advantages over prior-art approaches for current measurement. It would be very desirable, however if the shunt itself could be independently evaluated for its electrical properties in real time, even while the shunt is in operational service. Likewise it would be very desirable if each of the signal processing channels could be independently evaluated for its accuracy in real time, even while the shunt is in operational service. It would also be desirable if such improvements in the current measurement system could be achieved while adding only a very few additional electrical or electronic components to the system, and at only a modest additional cost. Repeating an earlier point, it is desirable to have an independent evaluation of the shunt and of the measurement circuitry.

SUMMARY OF THE INVENTION

Switching of particular inputs in a signal processing channel permits an independent evaluation of that signal processing channel, in a system where there are at least two signal processing channels, one of which is able to be calibrated while the other of which is measuring current in a shunt. Switching a controlled current through a shunt, the controlled current being small in value compared with an overall current being measured, permits yet another independent evaluation of the shunt.

DESCRIPTION OF THE DRAWINGS

The invention will be described with respect to a drawing in several figures.

FIG. 1 shows a current measurement system according to the '114 patent.

FIG. 2 shows an input switching arrangement of the current measurement system of FIG. 1 according to the '114 patent.

FIG. 3 shows a first embodiment of the invention as it relates to an improved input switching arrangement of the current measurement system.

DETAILED DESCRIPTION

Figure 4:
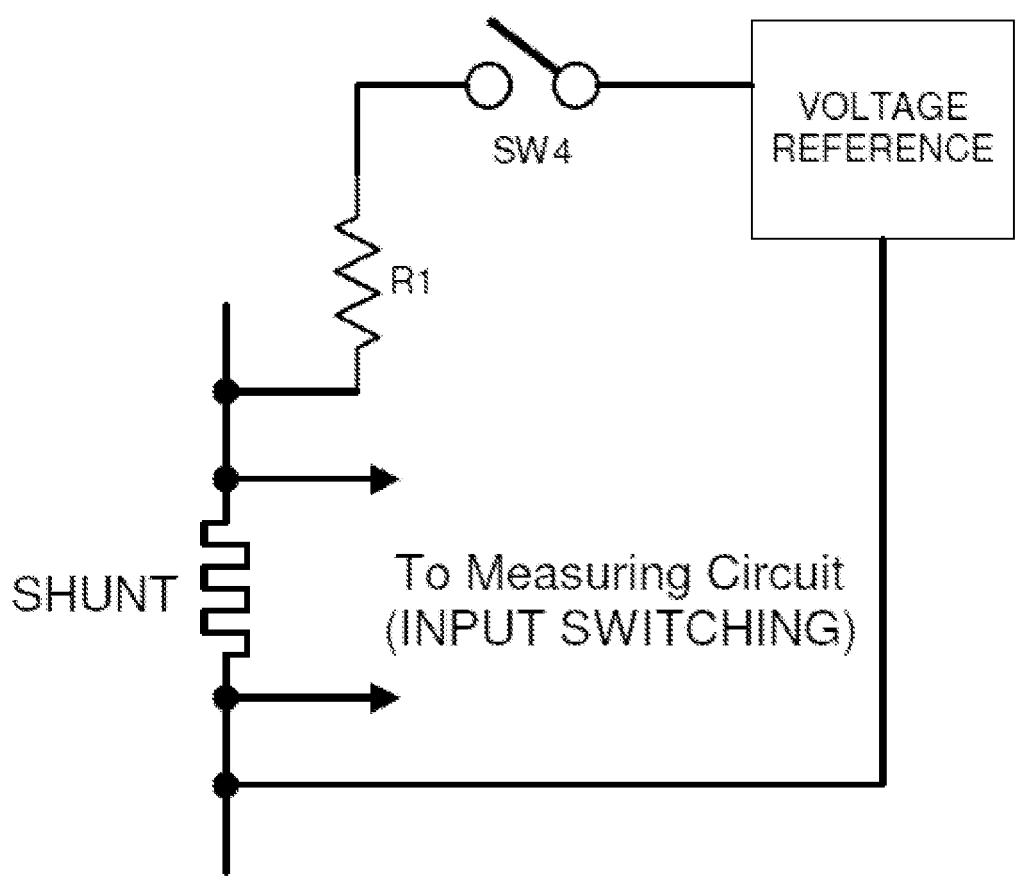
FIG. 4 shows a second embodiment of the invention as it relates to an improved circuit for evaluating the operation of the shunt and of the measurement circuitry.

FIG. 2 shows an input switching arrangement of the current measurement system of FIG. 1 according to the '114 patent. FIG. 3 shows a first embodiment of the invention as it relates to an improved input switching arrangement of the current measurement system. Referring back to FIG. 1, what were shown in that figure were two distinct signal processing channels, one above the other in the figure. In FIGS. 2 and 3, for clarity only one of the signal processing channels is shown.

The alert reader will recognize that the signal processing circuitry in FIG. 2 (and in FIG. 3, discussed below) has a differential input that feeds to an amplifier G. Amplifier G is preferably an operational amplifier, preferably having a very high impedance input, a relatively low impedance output, and very small offset between its differential input. This differential input is used for measuring a voltage drop as it develops across the resistive area of the shunt in reaction to the current passing through the shunt. As was discussed above, any particular signal processing circuitry as shown in FIG. 2 or FIG. 3 might at any particular time be in operational status on the one hand, or might be in a calibration mode on the other hand. The signal processing circuitry in FIG. 2 is shown in its operational mode, with SW1 closed and SW2 open. (It will be recalled from perusal of the '114 patent that each of the switches SW1 and SW2 is an analog switch.) The signal processing circuitry in FIG. 3 is likewise shown in its operational mode, with SW1 closed and SW2 open and SW3 open. (Each of the switches SW1 and SW2 and SW3 is an analog switch.) More will be said presently about switch SW3 and its associated circuitry such as the independent voltage reference.

As was just mentioned, in FIG. 2 the switches are shown in operational mode, with the signal processing circuitry pressed into operational service to measure the voltage drop across the sensing points of the shunt, thus providing an opportunity for the MCU to arrive at a measure of the current flowing through the shunt.

It will be recalled from the reader's familiarity with the '114 patent that in the system according to the '114 patent, during a calibration step, the switch SW1 is opened and switch SW2 is closed. This shorts out the input to the amplifier G. Were the amplifier G and its associated circuitry ideal in every way, the resulting analog output that is fed to the A/D converter would be null. The point of this calibration step, however, is to allow for the possibility that the amplifier G or its associated circuitry might be less than ideal in some respect, giving rise to a nonzero output to the A/D converter during this shorting-out step. Such a nonzero value represents some nonzero offset in the amplifier G or some spurious offset-like signal injected into the signal processing channel for example by the circuitry of the EMI/RFI filter.

The alert reader, due to familiarity with the '114 patent, will recall that what happens later is that the MCU makes note of this spurious offset value. This value can later be digitally subtracted from measured values when the signal processing channel is returned to operational service.

Now as we turn to FIG. 3, we can see a first embodiment of the invention as it relates to an independent verification of the gain of the amplifier G. The signal processing circuitry in FIG. 3 is shown in its operational mode, with SW1 closed and SW2 open and SW3 open. Now let us discuss what happens when this first embodiment of the invention offers its benefits. This happens during a calibration step. For calibration of the gain, the circuit in FIG. 3 has SW1 and SW2 open, and SW3 closed. Because SW3 is closed, a value from a known and trusted independent voltage reference is applied to an input of the amplifier G. This input to the amplifier G produces an analog level at the input of the A/D. This analog input to the A/D converter is evaluated, and variations of this level are digitally corrected by a multiplicative factor (that is a discrepancy between the expected value and the measured value for the gain of the amplifier G).

The alert reader will appreciate that the test voltage in FIG. 3 which is connected through switch SW3 might, economically, be drawn from the A/D voltage reference to the A/D converter as shown in FIG. 1, coupled through a suitable voltage divider. In this way, the value of that A/D voltage reference can be crosschecked with measurements of the independent voltage reference that would now be connected to a separate input of the A/D converter.

FIG. 4 shows a second embodiment of the invention as it relates to an improved circuit for evaluating the operation of the shunt and of the measurement circuitry.

The assumption at this point is that each of the two signal processing channels has been through a recent calibration. Once this is done, then at least one of the signal processing channels is placed into operational service, measuring the voltage drop across the two sensing locations on the shunt. In FIG. 4 this is seen with the shunt, having sensing points just above and just below the resistive area of the shunt. Electrical connections connect the two sensing points to the input switching fabric of FIG. 1 (omitted for clarity in FIG. 4) and thence to one or both of the signal processing channels (also omitted for clarity in FIG. 4).

What is depicted in FIG. 4 is that according to this second embodiment of the invention, there is provided a switch SW4 and a voltage reference. These are coupled to current injection points at the shunt, as shown in the figure. At some selected time, switch SW4 is closed. This applies a small but controlled voltage across the current injection points. This causes a small but controlled amount of current to be added to the current already passing through the shunt, given that the shunt is in operational service for measuring current passing therethrough.

Given that what might be passing through the shunt may be a very high current, for example in an EV, and given that the voltages involved may be tens or hundreds of volts, and given that the shunt floats electrically between the various nodes defined by the EV battery and the high-current loads such as wheel motors, it will be desirable if the voltage reference shown in FIG. 4 can be floating as well, not tied electrically to any particular other portion of circuitry or to any chassis ground. One way to do this would be by means of a "flying capacitor" that has been charged up by some known voltage source such as voltage reference shown in FIG. 1 or the independent voltage reference shown in FIG. 3.

Returning to the second embodiment of the invention, once calibration of both signal processing channels is accomplished, an independent evaluation of the resistance of the shunt can be performed, by introduction of a small current that is made to pass through the shunt. This current is generated by a simple circuit consisting of a stable resistor R1 and a switch SW4 that is activated under control of the MCU. As mentioned above, the traceable voltage source for this test current can be either an A/D voltage reference (with crosscheck as described above) or an independent voltage reference.

Independent evaluation for the resistance of the shunt allows for improved thermal compensation of the measured current. Combination of the measurement circuit's calibration/test activity, and of the evaluation of the shunt's resistance, provides a functional safety assurance for the correct operations of the complete measurement chain.

The entirety of U.S. patent application No. 62/976,260 filed Feb. 13, 2020 is incorporated herein by reference for all purposes.

It is thus instructive to describe in more detail the actual apparatus being used to carry out the invention, as well as the methods carried out in practicing the invention.

We may first turn our attention to the first embodiment of the invention. In the first embodiment, the current measurement apparatus comprises first and second measurement points shown for example in FIG. 1 just above and below the shunt resistive area. The first and second measurement points, also termed "sensing points" in the above discussion may also be seen in FIG. 4, just above and below the resistive area of the shunt.

The apparatus also comprises first and second instrumentation amplifiers, shown as first and second amplifiers G above and below in FIG. 1. Each instrumentation amplifier (also termed "amplifier G" in the discussion above) has first and second inputs, coupled through a respective impedance means to the sensing terminals. The impedance means are for example the input switching fabric shown in FIG. 1.

There is a third switch controllably providing a predetermined voltage reference to the first input terminal of one of the amplifiers, for example switch SW3 in FIG. 3, and a fourth switch controllably providing a predetermined voltage reference to the first input terminal of another of the amplifiers, again switch SW3 in FIG. 3. There is a shunt with first and second terminals, the current being measured is disposed to pass between said first and second terminals, and the shunt has the first and second measurement points (called "sensing points" above) disposed therebetween.

The steps carried out include:
at a first time, causing the first impedance means to disconnect the first instrumentation amplifier from the first and second measurement points and to close the third switch, while causing the second impedance means to connect the second instrumentation amplifier to the first and second measurement points, while providing current-measurement information from the second instrumentation amplifier to equipment external to the apparatus; and at a second time, causing the second impedance means to disconnect the second instrumentation amplifier from the first and second measurement points and to close the fourth switch, while causing the first impedance means to connect the first instrumentation amplifier to the first and second measurement points, while providing current-measurement information from the first instrumentation amplifier to equipment external to the apparatus.

During the first time, a calibration of a gain of the first instrumentation amplifier is carried out, and during the second time, a calibration of a gain of the second instrumentation amplifier is carried out.

We may then turn our attention to the second embodiment of the invention. In the second embodiment, the current measurement apparatus measures a first current with respect to first and second measurement points at the top left and bottom left of FIG. 1. There is at least one instrumentation amplifier, described above as an amplifier G, said instrumentation amplifier having first and second input terminals, and there is an impedance means connecting the first and second measurement points to the first and second input terminals of the instrumentation amplifier. There is a shunt with first and second terminals, the first current disposed to pass between said first and second terminals, the shunt having the first and second measurement points disposed therebetween (referred to above as sensing points).

In this second embodiment there is a current source switchably connected to the first and second terminals, whereby a second current of known and predetermined magnitude can be caused to flow at selected times between the first and second terminals in addition to the first current. This appears in FIG. 4, the current source comprising the voltage reference and resistor R1, and the control of this flow is by means of the switch SW4.

Steps carried out with this apparatus include:
at a first time, arriving at a measure of the first current by measuring a potential difference between the potential at the first measurement point and the potential at the second measurement point through the instrumentation amplifier; and
at a second time, switching the current source so that it is connected to the first and second terminals, whereby both the first current and the second current flow through the shunt, and arriving at a measure of the sum of the two currents by measuring a potential difference between the potential at the first measurement point and the potential at the second measurement point through the instrumentation amplifier.

The second current, in an exemplary embodiment, would be no larger than ten percent of the first current, and perhaps no larger than one percent of the first current.

A measure of the resistance of the shunt is arrived at by making use of the known and predetermined magnitude of the second current, and making use of a difference between the potential difference measured at the first time and the potential difference measured at the second time.

The alert reader, having received the benefit of the disclosures herein, will readily arrive upon obvious variants and improvements upon the invention, all of which are intended to be encompassed by the claims which follow.

The invention claimed is:

1. Apparatus for use in measuring current with respect to first and second measurement points, the apparatus comprising: a first instrumentation amplifier, said instrumentation amplifier having first and second input terminals, a first impedance means connecting the first and second measurement points to the first and second terminals of the first instrumentation amplifier; a second instrumentation amplifier, said instrumentation amplifier having first and second input terminals, a second impedance means connecting the first and second measurement points to the first and second input terminals of the second instrumentation amplifier, further characterized in that for the first instrumentation amplifier, there is provided a third switch controllably providing a predetermined voltage reference to the first input terminal thereof, and further characterized in that for the second instrumentation amplifier, there is provided a fourth switch controllably providing a predetermined voltage reference to the first input terminal thereof;

further comprising a control means, the control means disposed at times to cause the first impedance means to disconnect the first instrumentation amplifier from the first and second measurement points and to close the third switch, while causing the second impedance means to connect the second instrumentation amplifier to the first and second measurement points, while providing current-measurement information from the second instrumentation amplifier to equipment external to the apparatus, the control means disposed at other times to cause the second impedance means to disconnect the second instrumentation amplifier from the first and second measurement points and to close the fourth switch, while causing the first impedance means to connect the first instrumentation amplifier to the first and second measurement points, while providing current-measurement information from the first instrumentation amplifier to equipment external to the apparatus;

wherein the control means is further characterized in that the control means, when causing the first impedance means to disconnect the first instrumentation amplifier from the first and second measurement points and when closing the third switch, is disposed to carry out a calibration of a gain of the first instrumentation amplifier, the control means further characterized in that the control means, when causing second impedance means to disconnect the second instrumentation amplifier from the first and second measurement points and when closing the fourth switch, is disposed to carry out a calibration of a gain of the second instrumentation amplifier.

2. A method for use with apparatus for use in measuring current with respect to first and second measurement points, the apparatus comprising: a first instrumentation amplifier, said instrumentation amplifier having first and second input terminals, a first impedance means connecting the first and second measurement points to the first and second terminals of the first instrumentation amplifier; a second instrumentation amplifier, said instrumentation amplifier having first and second input terminals, a second impedance means connecting the first and second measurement points to the first and second input terminals of the second instrumentation amplifier, further characterized in that for the first instrumentation amplifier, there is provided a third switch controllably providing a predetermined voltage reference to the first input terminal thereof, and further characterized in that for the second instrumentation amplifier, there is provided a fourth switch controllably providing a predetermined voltage reference to the first input terminal thereof, the apparatus further comprising a shunt with first and second terminals, the current disposed to pass between said first and second terminals, the shunt having the first and second measurement points disposed therebetween, the method comprising the steps of:
- at a first time, causing the first impedance means to disconnect the first instrumentation amplifier from the first and second measurement points and to close the third switch, while causing the second impedance means to connect the second instrumentation amplifier to the first and second measurement points, while providing current-measurement information from the second instrumentation amplifier to equipment external to the apparatus;
- at a second time, causing the second impedance means to disconnect the second instrumentation amplifier from the first and second measurement points and to close the fourth switch, while causing the first impedance means to connect the first instrumentation amplifier to the first and second measurement points, while providing current-measurement information from the first instrumentation amplifier to equipment external to the apparatus further characterized in that during the first time, a calibration of a gain of the first instrumentation amplifier is carried out, and further characterized in that during the second time, a calibration of a gain of the second instrumentation amplifier is carried out.

3. A method for use with apparatus for use in measuring a first current with respect to first and second measurement points, the apparatus comprising an instrumentation amplifier, said instrumentation amplifier having first and second input terminals, an impedance means connecting the first and second measurement points to the first and second input terminals of the instrumentation amplifier, the apparatus further comprising a shunt with first and second terminals, the first current disposed to pass between said first and second terminals, the shunt having the first and second measurement points disposed therebetween, the apparatus further comprising a current source switchably connected to the first and second terminals, whereby a second current of known and predetermined magnitude can be caused to flow at selected times between the first and second terminals in addition to the first current, the method comprising the steps of:
- at a first time, arriving at a measure of the first current by measuring a potential difference between the potential at the first measurement point and the potential at the second measurement point through the instrumentation amplifier;
- at a second time, switching the current source so that it is connected to the first and second terminals, whereby both the first current and the second current flow through the shunt, and arriving at a measure of the sum of the two currents by measuring a potential difference between the potential at the first measurement point and the potential at the second measurement point through the instrumentation amplifier.

4. The method of claim 3 wherein the second current is no larger than ten percent of the first current.

5. The method of claim 4 wherein the second current is no larger than one percent of the first current.

6. The method of claim 3 further comprising the step of making use of the known and predetermined magnitude of the second current, and making use of a difference between the potential difference measured at the first time and the potential difference measured at the second time, to arrive at a measure of a resistance of the shunt.

\* \* \* \* \*